(12) United States Patent
Shibayama

(10) Patent No.: US 7,635,605 B2
(45) Date of Patent: Dec. 22, 2009

(54) INFRARED SENSOR AND METHOD OF PRODUCING THE SAME

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 287 days.

(21) Appl. No.: 10/590,510

(22) PCT Filed: Feb. 25, 2005

(86) PCT No.: PCT/JP2005/003118

§ 371 (c)(1),
(2), (4) Date: Jun. 5, 2007

(87) PCT Pub. No.: WO2005/083374

PCT Pub. Date: Sep. 9, 2005

(65) Prior Publication Data

US 2007/0278605 A1    Dec. 6, 2007

(30) Foreign Application Priority Data

Feb. 26, 2004    (JP)    ............ P2004-052114

(51) Int. Cl.
*H01L 21/00*    (2006.01)
(52) U.S. Cl. .............. 438/53; 438/54; 438/68; 257/E21.522; 257/E21.523; 257/E21.535
(58) Field of Classification Search ............ 438/53, 438/54, 68; 257/E21.522, E21.523, E21.535
See application file for complete search history.

(56) References Cited

U.S. PATENT DOCUMENTS

| 5,895,233 A | 4/1999 | Higashi et al. |
| 7,417,229 B2 * | 8/2008 | Sasaki et al. ............ 250/338.1 |
| 7,429,495 B2 * | 9/2008 | Wan ............ 438/53 |

FOREIGN PATENT DOCUMENTS

| JP | 61-19734 | 2/1986 |
| JP | 4-158584 | 6/1992 |
| JP | 5-235415 | 9/1993 |
| JP | 5-283757 | 10/1993 |
| JP | 5-81666 | 11/1993 |
| JP | 6-249708 | 9/1994 |
| JP | 2663612 | 6/1997 |
| JP | 2000-28463 | 1/2000 |
| JP | 2001-174324 | 6/2001 |
| WO | 95/17014 | 6/1995 |
| WO | WO 02/084235 | 10/2002 |

* cited by examiner

*Primary Examiner*—Ngan Ngo
(74) *Attorney, Agent, or Firm*—Drinker Biddle & Reath LLP

(57) ABSTRACT

A through hole P of this infrared sensor is formed in a position opposed to an adhesive layer AD. The through hole P, the bottom part thereof and an insulating film Pi formed therein is restrained from being deteriorated and damaged, in order to improve the characteristics of the infrared sensor, since the through hole P and the bottom part thereof are supported by the adhesive layer AD even when a pressure difference is generated between the inside and the outside in the space partitioned by the adhesive layer AD.

2 Claims, 14 Drawing Sheets

INFRARED SENSOR AND METHOD OF PRODUCING THE SAME

TECHNICAL FIELD

The present invention relates to an infrared sensor and a method for manufacturing the same.

BACKGROUND ART

Thermopile type infrared sensors shown in the following Patent References 1 to 3 have been conventionally known. In such infrared sensors, a thermocouple is formed by adjacent polysilicon and aluminum, and an infrared ray which is made incident is detected by an infrared detecting part due to this thermocouple.

A thermopile is obtained by arranging the thermocouples in series in a fine area. The thermocouple is a temperature sensor using the principle of the "Seebeck effect" in which a circuit is produced by two kinds of metals and a thermal electromotive force is generated to flow a current when the two junction points thereof are maintained at different temperatures. In the thermocouple, the thermal electromotive force between a temperature measuring junction (hot junction) and a reference junction (cold junction) is measured.

The infrared sensor shown in Patent Reference 1 is an example in which the thermocouple which is composed by p-type and n-type semiconductors is formed on a cantilever. These measure the amount of an infrared ray made incident into the infrared sensor from an electromotive force produced by the temperature difference between the hot junction and cold junction of the thermocouple due to the Seebeck effect, and the high sensitivity of the infrared sensor is realized by arranging a plurality of thermocouples. The infrared sensor provided with an infrared filter is described in Patent Reference 3. An example in which the infrared sensor is formed on an insulated substrate is shown in Patent Reference 3.

[Patent Reference 1]

Japanese Patent Publication No. 2663612

[Patent Reference 2]

Japanese Published Unexamined Patent Application No. Hei-6-249708

[Patent Reference 3]

Japanese Published Unexamined Patent Application No. 2001-174324

DISCLOSURE OF THE INVENTION

Problems to be Solved by the Invention

However, when forming a through hole for extracting an output in the semiconductor substrate and bonding a silicon substrate to the semiconductor substrate, a space for enhancing temperature detection characteristics is required between the infrared detecting part and the silicon substrate. There is a problem that an insulating film formed in the through hole is deteriorated and damaged by a pressure difference between the inside of the space and the outside of the infrared sensor, and the characteristics are deteriorated.

The present invention has been made in view of the problems described above, and it is an object of the present invention to provide an infrared sensor capable of enhancing the characteristics and a method for manufacturing the same.

Means for Solving the Problems

In order to solve the above problems, an infrared sensor according to the present invention includes: a semiconductor substrate on which an infrared detecting part is formed; an infrared transmissive substrate which is located opposite the semiconductor substrate; an adhesive layer which is partially interposed between the semiconductor substrate and the infrared transmissive substrate and forms a space between the substrates, wherein the semiconductor substrate has a through hole for extracting an electric signal from the infrared detecting part in a position opposed to the adhesive layer.

An infrared ray made incident into this infrared sensor is transmitted through the infrared transmissive substrate, and is made incident into the infrared detecting part such as a thermocouple. The infrared detecting part converts the incident infrared ray into an electric signal. This electric signal is extracted to an outside via a through hole. The infrared detecting part is arranged in the space formed by the adhesive layer interposed between the semiconductor substrate and the infrared transmissive substrate. Therefore, the response characteristics with respect to the temperature change of the infrared detecting part are enhanced.

The through hole is formed in a position opposed to the adhesive layer. Therefore, the through hole and an insulating film formed therein are restrained from being deteriorated and damaged, in order to enhance the characteristics of the infrared sensor, since the through hole and the bottom part thereof are supported by the adhesive layer even when a pressure difference is generated between an inside and an outside in the space, for example, in the case of mounting, etc.

Additionally, it is preferable that a deflection preventing wall for restraining deflection of the infrared transmissive substrate to the infrared detecting part side is provided in the space. When the infrared transmissive substrate is deflected, the infrared transmissive substrate comes into contact with the infrared detecting part. The infrared detecting part is then damaged or comes into contact therewith, and thereby the thermal conductance may be increased to cause a reduction in the sensitivity. This deflection preventing wall is provided in order to prevent damage and sensitivity deterioration, and the height of the deflection preventing wall from the semiconductor substrate is higher than the upper surface of the infrared detecting part. When the infrared transmissive substrate is deflected, the infrared transmissive substrate comes into contact with the deflection preventing wall, thereby restraining the amount of the deflection of the infrared transmissive substrate.

When there are a plurality of the infrared detecting parts, it is preferable that the deflection preventing wall is provided between the infrared detecting parts. That is, when there are a plurality of the infrared detecting parts, the infrared transmissive substrate is enlarged. However, in this case, the deflection preventing wall is provided between the infrared detecting parts, and thereby the amount of the deflection can be wholly restrained.

It is preferable that the infrared detecting parts are formed on a membrane structure formed on the semiconductor substrate, and in this case, the response with respect to the temperature change in the infrared detecting part can be enhanced.

Additionally, it is preferable that a vacuum is produced in the space between the semiconductor substrate and the infrared transmissive substrate via the adhesive layer. Thermal conductance, convection and radiation are considered as the movement of thermal energy. As described later, the infrared detecting part is formed on a thin film in which heat is not readily conducted, and thereby a part relating to the thermal conductance of the movement of the heat from the infrared detecting part retains the heat. The vacuum is produced in the space constituted between the infrared transmissive substrate and the semiconductor substrate, and thereby the infrared ray (heat) made incident into the infrared detecting part formed on the semiconductor substrate is not escaped to the space side by convection, the detection of higher sensitivity can be achieved. The remaining radiation can be detected with higher sensitivity by providing an infrared reflection film which is made of metal, etc., on a surface which is located opposite the infrared detecting part of the semiconductor substrate.

A method for manufacturing the above infrared sensor, includes the steps of: forming an infrared detecting part on a thin film becoming a membrane to be formed on a semiconductor substrate; forming a hollow part at the lower side of the thin film on which the infrared detecting part is formed to form a membrane structure; partially forming an adhesive layer on at least one of the semiconductor substrate and an infrared transmissive substrate made of silicon, etc., so that a space is formed between the semiconductor substrate and the infrared transmissive substrate, and then bonding the infrared transmissive substrate to the semiconductor substrate via the adhesive layer; and forming a through hole in the semiconductor substrate from the opposite side of the semiconductor substrate to the infrared transmissive substrate, wherein the through hole is formed in a position opposed to the adhesive layer.

According to this manufacturing method, the through hole, etc., is restrained from being deteriorated and damaged at the time of the formation of the through hole by the support due to the adhesive layer, and thereby the above infrared sensor having excellent characteristics can be manufactured.

Additionally, it is preferable that a dicing line between the infrared sensors is cut after forming the through hole when forming a plurality of infrared sensors, to separate the infrared sensors into each of the infrared sensors. In this case, since the bonding of the semiconductor substrate and infrared transmissive substrate and the formation of the through hole are completed, products about equal to a final shipping configuration are completed by the separation of each of the infrared sensors by the dicing. Therefore, according to this manufacturing method, the productivity is enhanced at low cost.

Effect of the Invention

The characteristics can be enhanced by the infrared sensor of the present invention and the method for manufacturing the same, and the productivity can also be further enhanced at low cost.

DESCRIPTION OF THE SYMBOLS

Figure 1:
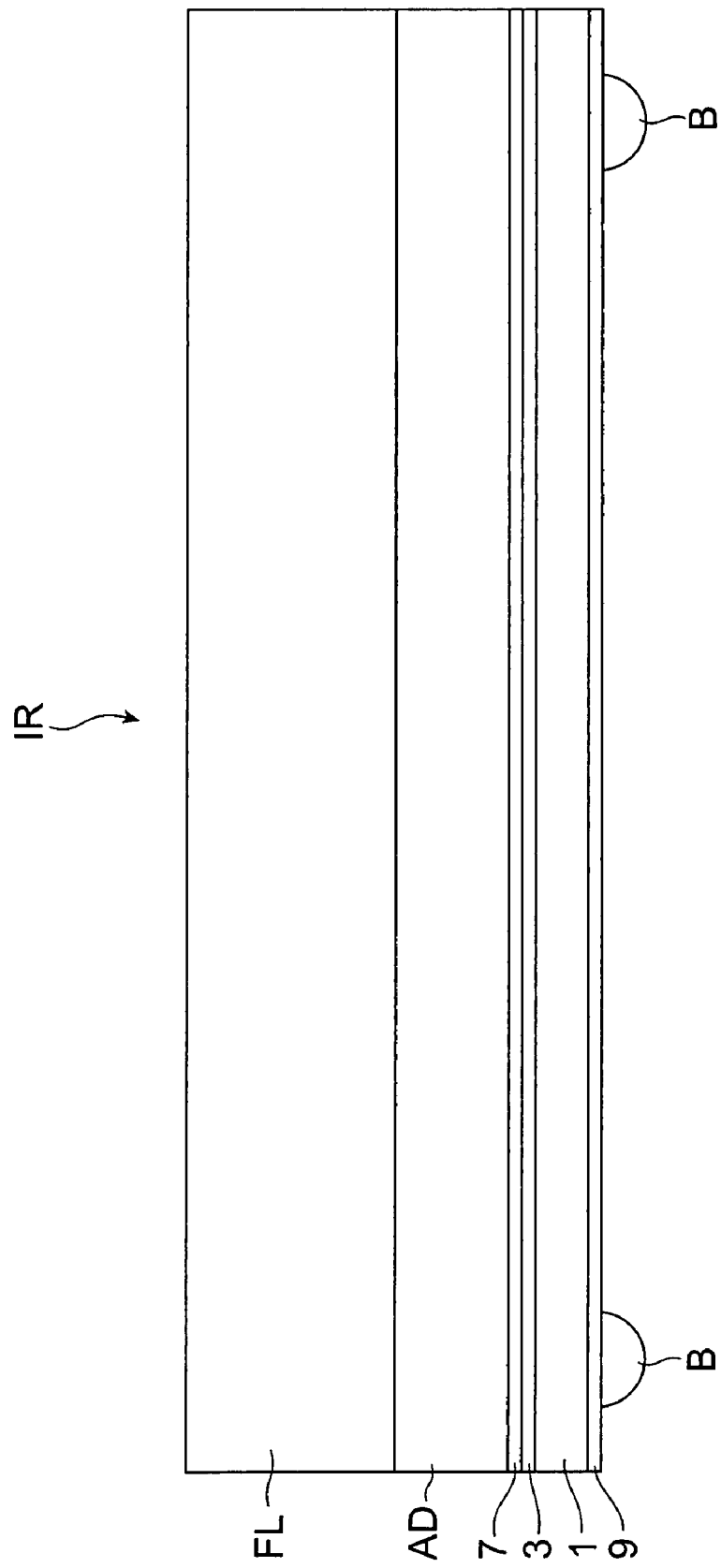
FIG. 1 is a side view of an infrared sensor according to the embodiment.

1: Semiconductor substrate
2: Hollow part
3: Thin film
4: Polysilicon film
5: Insulating film
6: Aluminum film
7: Passivation film
8: Infrared absorption film
9: Insulating film
10: Terminal
11: Hot junction
12: Cold junction
13: Etching hole
AD: Adhesive layer
B: Bump
CE: Contact electrode
CH: Contact hole
DL: Upper space
FL: Infrared transmissive substrate
IRP: Infrared detecting part
P: Through hole
Pi: Insulating film
SP: Internal space
STP: Deflection preventing wall

BEST MODES FOR CARRYING OUT THE INVENTION

Hereinafter, the embodiment according to the present invention will be described with reference to the accompanying drawings. However, identical components are designated by the same reference numerals, and overlapping description is omitted. The ratio of the size of each of the constituent components, in particular, the thickness, etc., of each of the respective layers may be different from reality in order to emphasize convenience of explanation.

Figure 2:
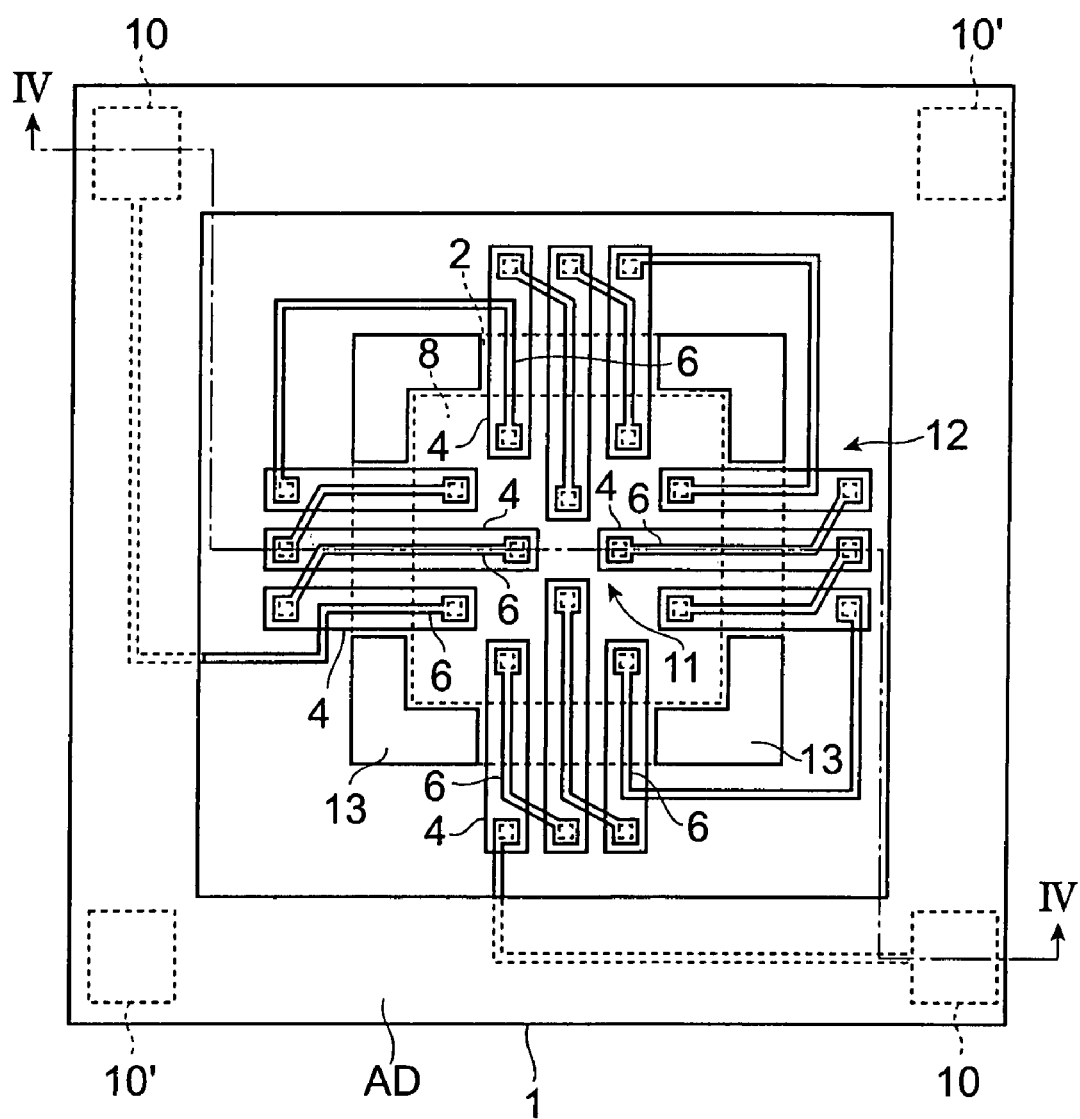
FIG. 2 is a front view (a plan view of the infrared sensor with an infrared transmissive substrate removed) of the infrared sensor according to the embodiment.
Figure 3:
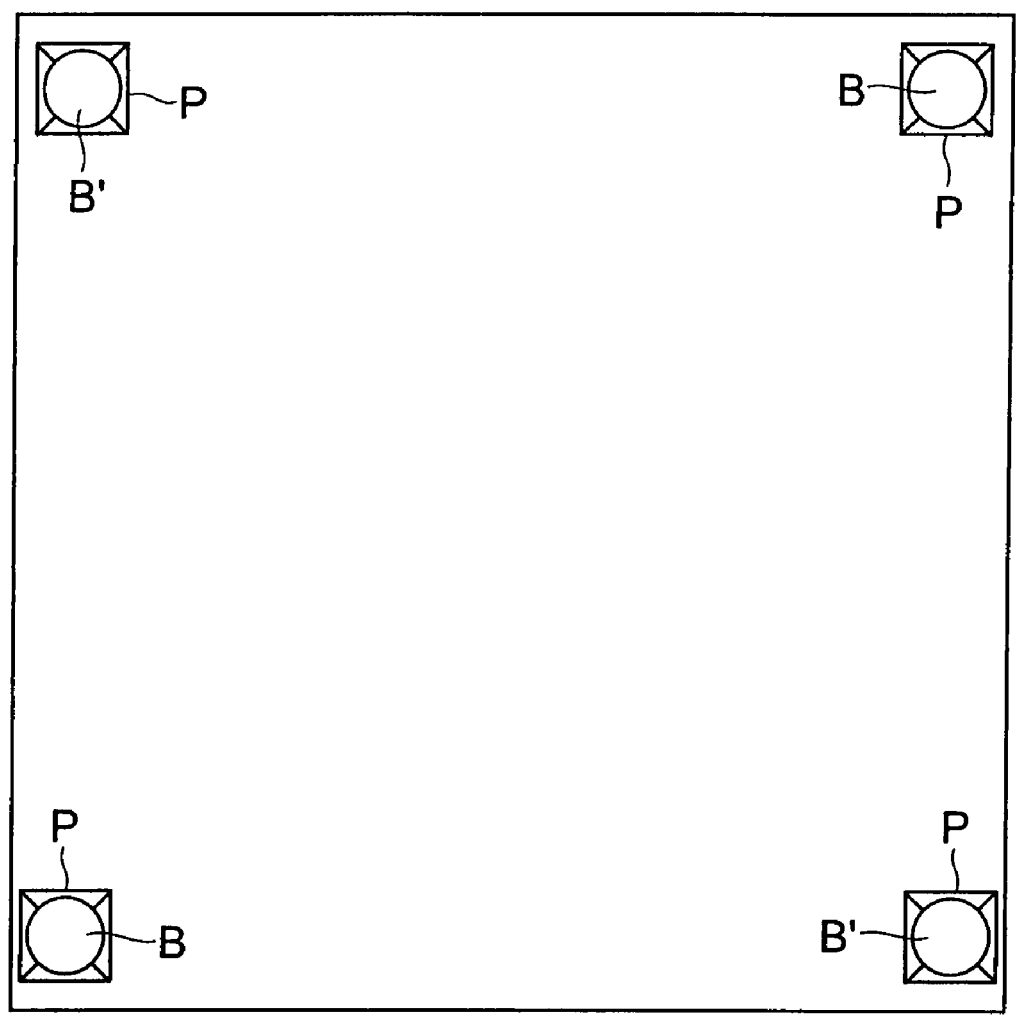
FIG. 3 is a bottom view of the infrared sensor.
Figure 4:
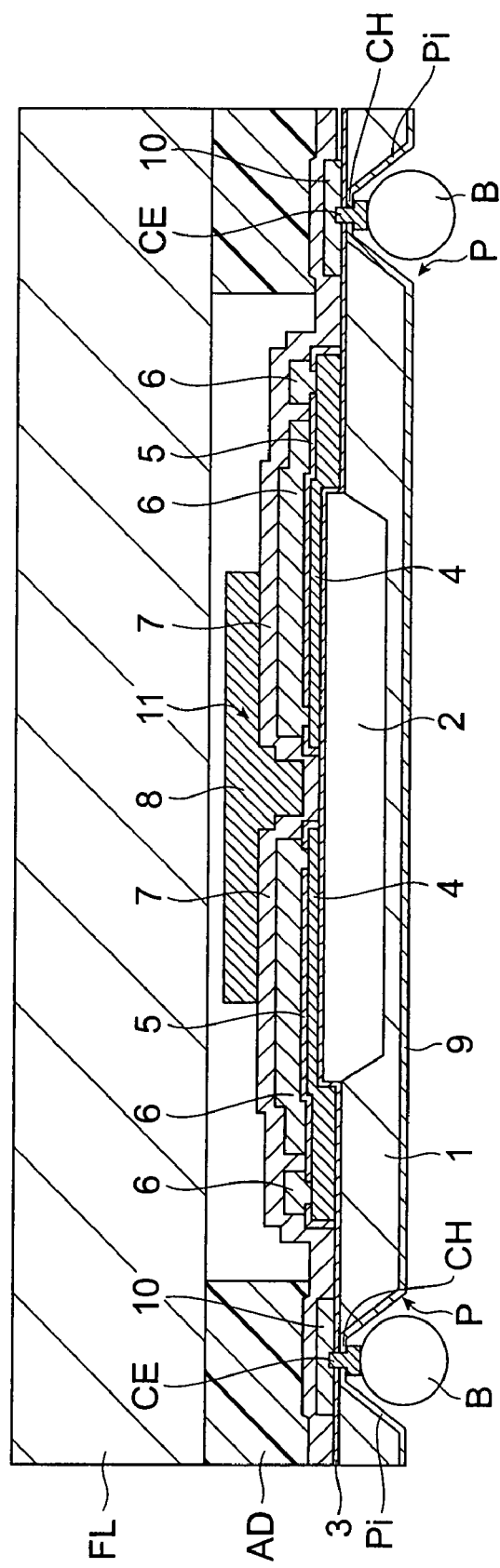
FIG. 4 is a cross sectional view of FIG. 2 taken along line IV-IV.
Figure 14:
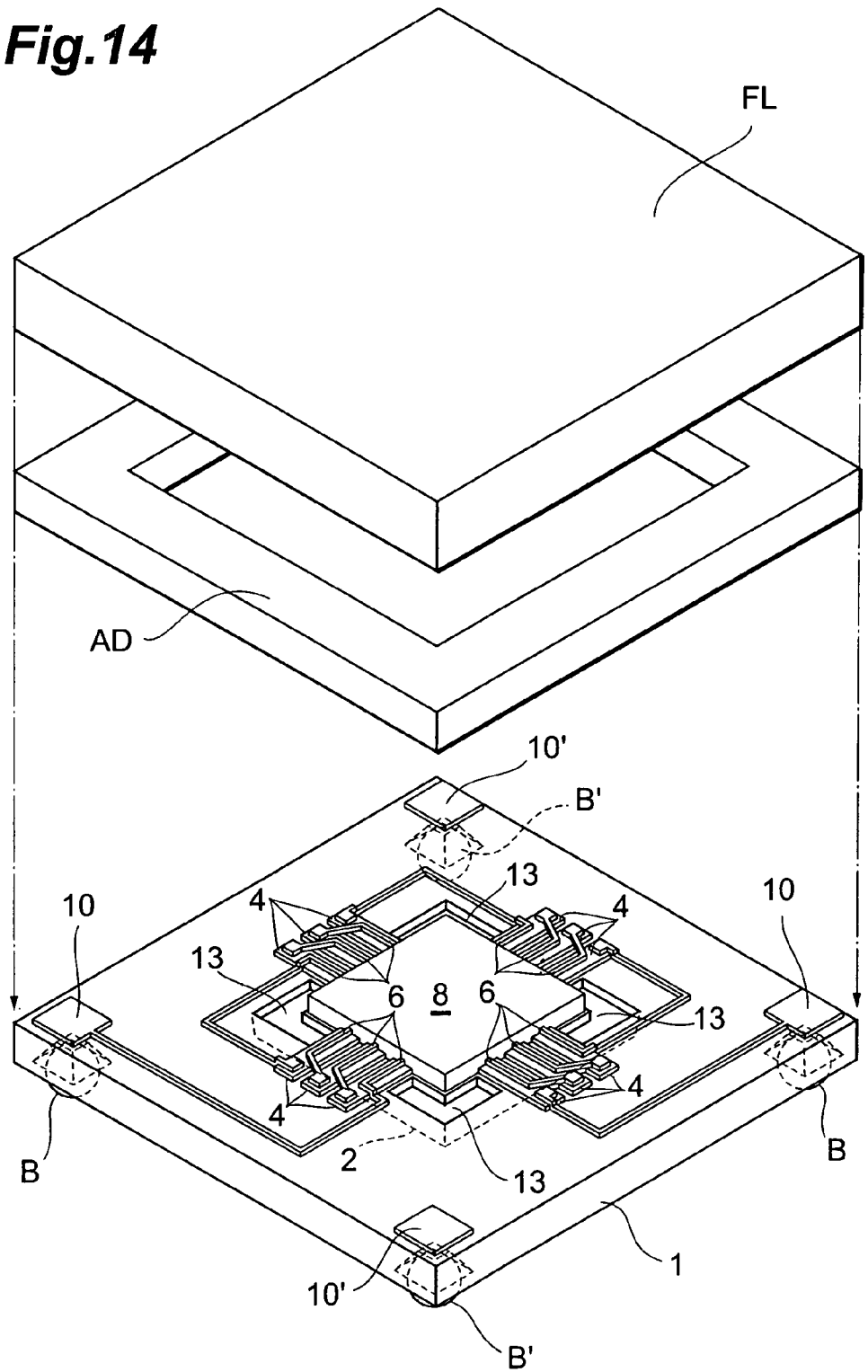
FIG. 14 is an exploded perspective view of an infrared sensor showing arranged disassembly parts of an infrared sensor according to the embodiment.

FIG. 1 is a side view of an infrared sensor according to the embodiment. FIG. 2 is a plan view of the infrared sensor with an infrared transmissive substrate removed. FIG. 3 is a bottom view of the infrared sensor. FIG. 4 is a cross sectional view of FIG. 2 taken along line IV-IV. FIG. 14 is an exploded perspective view of an infrared sensor showing arranged disassembly parts of an infrared sensor according to the embodiment.

A supporting member having a membrane structure has a semiconductor substrate 1 provided with a thin plate part having a hollow part 2 and a thin film (thermal insulating film) 3 supporting and reinforcing the thin plate part. The semiconductor substrate 1 is composed by a silicon substrate. The rear side of the infrared sensor is blocked by the semiconductor substrate 1, and etching holes 13 are formed in four places of a passivation film 7 formed on the surface of the infrared sensor. That is, the hollow part 2 is formed below the thin film 3. Since this infrared sensor has a structure where the rear side thereof is blocked by the semiconductor substrate 1, the infrared sensor is readily die-bonded to a supporting member such as a lead frame and a circuit board, and thereby the mechanical strength is enhanced.

The thin film 3 may be made of an SiN single layer, a $SiO_2$ single layer, or a multilayer film containing any of SiN, $SiO_2$, PSG and BPSG, and has a film thickness of 0.1 to 5 µm.

A polysilicon film 4 in which n-type or p-type impurities of $10^{17}$ to $10^{20}$ cm$^{-3}$ are doped and an $SiO_2$ film 5 as an insulating film are laminated on the thin film 3, and an aluminum film 6 is laminated on the $SiO_2$ film 5. The polysilicon film 4 is connected to the aluminum film 6 via an opening part of the $SiO_2$ film 5 to form a thermocouple.

The exposed surfaces of the thin film 3 and thermocouple are covered with the passivation film 7 made of SiN, and an infrared absorption film 8 is formed on the passivation film 7 above the hollow part 2. The $SiO_2$ film 5 is interposed between the polysilicon film 4 and the aluminum film 6 except the opening part as a contact point of these two films, and the passivation film 7 exists on the aluminum film 6. However, in FIG. 14, the description of the $SiO_2$ film 5 and passivation film 7 is omitted for clarifying the structure.

In a thermal-type infrared sensor, the infrared absorption film 8 is provided in order to obtain infrared rays as thermal energy.

A single layer such as PSG, BPSG and SiN, or a laminated film composed by the insulating layer thereof, etc., may be used instead of the $SiO_2$ film 5. The passivation film 7 may be a single layer such as $SiO_2$, PSG, BPSG and a polyimide film, or an insulating film of a laminated layer thereof. A blackening resin is used for the infrared absorption film 8. As this blackening resin, there may be used a resin (an epoxy type, silicone type, acrylic type, urethane type and polyimide type resin, etc.) with which a black filler such as a carbon filler is mixed, and a black resist, etc.

As shown in FIG. 2, long laminated structures of the polysilicon film 4 and aluminum film 6 are formed so as to extend to the upper part of the hollow part 2 in the center of the semiconductor substrate 1 from the upper part of the outer edge of the semiconductor substrate 1. The shape of the hollow part 2 is a rectangle (a square or an oblong), and each of the laminated structures extends along the four directions perpendicular to the four sides of the hollow part 2.

The polysilicon film 4 and the aluminum film 6 are laminated on the hollow part 2, and the width of the aluminum film 6 is narrower than that of the polysilicon film 4. The laminated polysilicon film 4 and aluminum film 6 are connected to each other via the opening part of the $SiO_2$ film 5 in the region on which the infrared absorption film 8 is formed, thereby a hot junction 11 is formed. The adjacent polysilicon film 4 and aluminum film 6 are connected to each other via the opening part of the $SiO_2$ film 5 of the upper part of the semiconductor substrate 1, thereby a cold junction 12 is formed. These thermocouples are connected in series and an electromotive force produced by the Seebeck effect is extracted by a terminal 10.

Since this laminated structure is the thermocouple, the laminated structure functions as thermoelectric type infrared detecting parts (thermopile) 4 and 6. That is, the infrared detecting part is formed on the semiconductor substrate 1. An infrared transmissive substrate FL composed by a silicon substrate is located opposite the semiconductor substrate 1. The infrared transmissive substrate FL functions as an infrared transmissive filter. Or, the transmissivity of the infrared transmissive substrate can be enhanced by adding an antireflection film to one side or both sides of the infrared transmissive substrate, and a band pass filter for only transmitting a required wavelength can be formed.

An adhesive layer AD is partially interposed between the semiconductor substrate (first silicon substrate) 1 and the infrared transmissive substrate (second silicon substrate) FL. The adhesive layer AD forms a space between the semiconductor substrate 1 and the infrared transmissive substrate FL. The thickness of the adhesive layer AD is set so as to be higher than the upper surface of the infrared absorption film 8, and a clearance is interposed between the infrared absorption film 8 or the infrared detecting part and a surface of the infrared transmissive substrate FL located opposite the semiconductor substrate.

The adhesive layer AD of this example is composed by a layer capable of being anodic-bonded to silicon, such as Pyrex (trade name) glass. At least one of the semiconductor substrate (first silicon substrate) 1 and the infrared transmissive substrate (second silicon substrate) FL is anodic-bonded to the adhesive layer AD. An inside surface of the infrared transmissive substrate FL which is located opposite the hollow part 2 may constitute a recessed part. In this case, the circumference of the inside surface of the infrared transmissive substrate FL constitutes a convex part, and the convex part and the adhesive layer AD are adhered to each other. The adhesive layer AD is formed at the outer edge part of the semiconductor substrate 1, and constitutes a rectangular and annular frame part. Therefore, the adhesive layer AD is interposed between the outer edge part of the semiconductor substrate 1, and the outer edge part of the infrared transmissive substrate FL, and seals the internal space of the infrared sensor from external air. This internal space is preferably set to a vacuum state. A vacuum is produced in the internal space between the infrared transmissive substrate and the semiconductor substrate, and the infrared ray (heat) made incident into the infrared absorption film of the infrared detecting part formed on the semiconductor substrate is not released to the side of the space by convection, thereby the detection of higher sensitivity can be achieved.

For example, the adhesive layer AD is preferably made of borosilicate glass containing an alkali metal of #7740, etc., of Corning, Inc. This is because the thermal expansion coefficient α of this glass is $3.4 \times 10^{-6}$ and is close to the thermal expansion coefficient β of silicon (=$3.6 \times 10^{-6}$). That is, in this case, a thermal stress due to the difference in the thermal expansion coefficient in the manufacturing process is minimized, and the stress is not readily applied to a part where the mechanical strength is weak such as the hollow part.

That is, though α/β is 94.4% in this example, α/β is preferably not less than 90% and not more than 110%.

Though the semiconductor substrate and the adhesive layer AD are anodic-bonded to each other by using an anodic bonding device for the adhesion of the adhesive layer AD, the anodic bonding is performed at a low temperature of 400° C. or less. Though a voltage of approximately 250 to about 800 V is applied between the semiconductor substrate 1 and the infrared transmissive substrate FL at the time of anodic-bonding, the above thermal stress can also be restrained since the temperature at the time of anodic-bonding is comparatively low. The internal space of the infrared sensor can be sealed in a vacuum state by performing the anodic bonding in a vacuum device.

When the anodic bonding is performed in an inactive gas atmosphere such as nitrogen and xenon, the internal space of the infrared sensor can be sealed in a state where the internal space is filled with an inactive gas such as nitrogen, xenon, krypton and argon. Since the infrared detecting part, the membrane structure and the infrared absorption film can be prevented from coming into contact with oxygen by filling the internal space between the infrared transmissive substrate and the semiconductor substrate with nitrogen or xenon and sealing the internal space, the infrared detector without deterioration can be produced. Furthermore, the internal space is filled with a heavy weight gas having a low thermal conductivity such as xenon, krypton and argon at a low pressure of, for example, 10 to 100 mmHg, and thereby it can make it difficult to generate convection. Accordingly, the escape of the heat due to convection from the infrared detecting part is restrained, thereby the detection of higher sensitivity can be achieved.

In the vacuum sealing, a getter material may be provided in the internal space between the semiconductor substrate 1 and the infrared transmissive substrate FL. Thereby, the pressure in the internal space can be kept in a vacuum over a long period of time, and the stability of the infrared sensor is enhanced. As the getter material, a material essentially containing barium, titanium and zirconium, etc., can be used.

Since the mechanical strength of the infrared sensor is increased when the infrared transmissive substrate FL is used with the adhesive layer AD, the thickness of the semiconductor substrate 1 can be advantageously reduced. That is, after the adhesion of the infrared transmissive substrate FL, the semiconductor substrate 1 can be thinned by mechanically and chemically polishing the rear surface of the semiconductor substrate 1, and the aspect ratio of the through hole P in the depth direction can be reduced. In the thinning process, a dry etching or a wet etching can be used in addition to a mechanical polishing. When the process of the rear surface side is performed, the process is performed with the rear surface side facing upward.

The reduction in the aspect ratio due to this thinning is very useful, and the formation time of the through hole P can be shortened. In addition, a high-quality insulating film Pi can be formed on the inner wall face of the through hole P. That is, when forming the insulating film Pi on the inner wall face of the through hole P and the depth of the through hole P is shallow, a high-quality insulating film Pi having a superior coating property can be formed by a plasma CVD method or a sputtering method.

In other words, the insulating film Pi formed on the inner wall face of the through hole P can be satisfactorily manufactured by using the adhesive layer AD and the infrared transmissive substrate FL, and as a result, the enhancement in the characteristics of the infrared sensor can be expected. Hereinafter, the advantage of thinning is summarized.

Since the depth of the through hole P becomes shallow, the terminal (electrode pad) 10 and the contact electrode CE can be made finer, and formed with a narrow interval.

Since the area of the terminal 10 can be reduced, the areas of the infrared detecting parts 4 and 6 can be relatively enlarged, and the detection sensitivity can be improved.

The etching time at the time of forming the through hole P is shortened.

Since the depth of the through hole P is shallow, the coating property of the insulating film Pi can be enhanced.

Since the coating property of the insulating film Pi is enhanced, the probability of short-circuiting between the bump B and the semiconductor substrate 1 can be reduced.

Since the depth of the through hole P is shallow, it is easy to apply a photoresist at the time of forming the contact electrode CE, and the blur amount of an exposure pattern in the bottom part of the through hole P in a photolithography process is also reduced.

Since it becomes unnecessary to form a long wiring such as a so-called a penetrating wiring in the through hole P, the yield is enhanced.

As described above, in the infrared detecting parts 4 and 6, different materials (aluminum and polysilicon) in which a thermal electromotive force is generated are electrically connected in series. The terminals (pads) 10 of the both ends of this series connection circuit are formed on the thin film 3 of the semiconductor substrate 1. On the other hand, the semiconductor substrate 1 has the through holes P for extracting the output of the infrared detecting part from the terminal 10 in a position opposed to the adhesive layer AD. That is, the outer edge part of the semiconductor substrate 1, the terminal 10, the adhesive layer AD and the outer edge part of the infrared transmissive substrate FL are located on the axis line of the through hole P.

The terminal 10 is located at two corners of the semiconductor substrate 1 of which the plane shape is rectangular. Dummy terminals 10' provided at the remaining corners enhance the mounting stability of the infrared sensor.

The through hole P has a truncated pyramid, and the bump B having a shape about equal to a sphere is arranged in the through hole P. The diameter of the through hole P is reduced from the rear surface side to the front surface side of the semiconductor substrate 1, and the through hole P has a tapered shape. In this example, one bump B may be arranged at one through hole P and only one of the opening diameter may be set to be much longer than the other one, and the through hole P may constitute a groove, in which many bumps B are arranged. The aspect ratio (hole depth/opening diameter) of the depth of the hole with respect to the opening diameter of the through hole P is desirably 1 or less. The bump B having a part slightly protruding from the through hole P of the semiconductor substrate 1 is readily attached to the circuit board.

Figure 5:
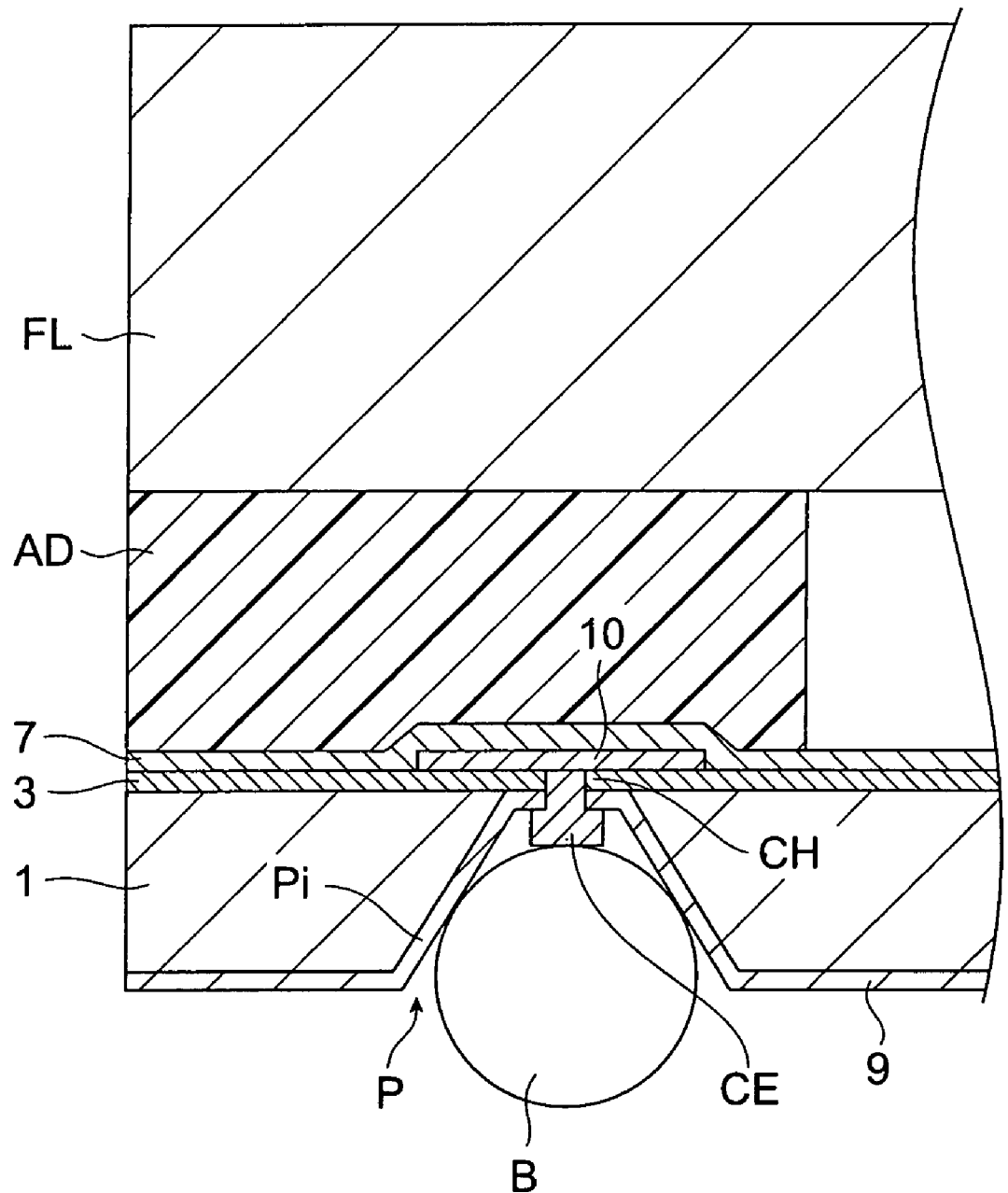
FIG. 5 is an enlarged view of the circumferential part of a through hole P.

FIG. 5 is an enlarged view of the circumferential part of a through hole P.

The insulating film Pi which is made of $SiO_2$ is formed on the inner surface of the through hole P. The bump B comes into contact with the insulating film Pi. The insulating film Pi in the through hole P is continued to the insulating film 9 covering the rear surface of the semiconductor substrate 1. The bump B is connected with the terminal 10 via the contact electrode CE in a contact hole CH provided in the thin film 3.

That is, referring to FIG. 2, one bump B is electrically connected with the aluminum film 6, the polysilicon film 4, the aluminum film 6 and the polysilicon film 4 . . . in this order via one terminal 10, and is electrically connected with the other bump B via the polysilicon film 4, a wiring and the other terminal 10. A dummy bump B' shown in FIG. 3 can also be provided directly under a dummy terminal 10' as in the circumferential part of the terminal 10.

The insulating film Pi is not limited to $SiO_2$, and may be a single layer insulating film such as PSG, BPSG, SiN, SiON and a polymer, or a laminated film made thereof.

The function of the above infrared sensor will be described.

The infrared ray made incident into this infrared sensor is transmitted through the infrared transmissive substrate (infrared transparent window) FL which is composed by the silicon substrate to which an antireflection film coating is applied, and is made incident into the infrared detecting parts 4 and 6 such as the thermocouple. The infrared detecting parts 4 and 6 convert the infrared ray made incident into the infrared detecting parts 4 and 6 into an electric signal.

This electric signal is extracted to the outside via the through hole P. The infrared detecting parts 4 and 6 are arranged in the space formed by the adhesive layer AD which is interposed between the semiconductor substrate 1 and the infrared transmissive substrate FL. Therefore, the response characteristics with respect to the temperature change of the infrared detecting parts 4 and 6 are improved.

Since the infrared detecting parts 4 and 6 are particularly formed on the membrane structure which is composed by the thin film 3 formed on the semiconductor substrate 1 and have the hollow part 2 below the thin film 3, the response with respect to the temperature change of the infrared detecting parts 4 and 6 is further improved.

As described above, the through hole P is provided in a position opposed to the adhesive layer AD. Therefore, the through hole P and the insulating film Pi formed therein is restrained from being deteriorated and damaged, in order to enhance the characteristics, yield and productivity of the infrared sensor, since the through hole P and the bottom part thereof are supported by the adhesive layer AD even when a pressure difference is generated between the inside and the outside in the space partitioned by the adhesive layer AD.

Also, since the polysilicon film 4 and the aluminum film 6 are laminated and formed in the above infrared sensor, the arrangement region with respect to one thermocouple becomes narrow, and thereby the thermocouple can be densely arranged. A thermopile pattern obtained by laminating the polysilicon film 4 and the aluminum film 6 via the $SiO_2$ film 5 has a three-layered structure, and thereby the mechanical supporting strength is improved. Since the thermopile pattern is formed in mesa to the upper part of the extension part of the semiconductor substrate 1 from the upper part of the thin film 3 above the hollow part 2, the mechanical strength of the thin film 3 can be enhanced.

Since the infrared absorption film 8 which is made of a material having an adhesive force in the upper part of the thin film 3 above the hollow part 2 and which is a single lump fixing the thin film 3 and all of the thermopile patterns, the mechanical strength of a region having a thin thickness in the thin film 3 above the hollow part 2 due to the hollow part 2 can be further improved. Since the infrared absorption film 8 is formed so as to cover the whole hot junction 11 of the thermopile pattern, the heat generated in the infrared absorption film 8 by the absorption of the infrared ray can be efficiently conducted to the hot junction 11.

Since the aluminum film 6 has favorable thermal conductivity, the heat obtained in the hot junction may be conducted and escaped to the semiconductor substrate 1 to cause a reduction in the sensitivity of the infrared sensor. However, since the aluminum film 6 is thinly and slimly laminated via the $SiO_2$ film 5 on the polysilicon film 4, the aluminum film 6 is thermally insulated from the semiconductor substrate 1, and thereby the sensitivity of the infrared sensor is not reduced. The $SiO_2$ film 5 also has a heat insulating function for not only electrically insulating the polysilicon film 4 from the aluminum film 6 but also hardly conducting the heat of the polysilicon film 4 to the aluminum film 6.

The infrared ray made incident into the infrared absorption film 8 may be reflected on the aluminum film 6 formed below the infrared absorption film 8, thereby the reduction in the sensitivity of the infrared sensor may be caused. However, since the aluminum film 6 is thinly formed, the reflection can be minimized, and since the reflected infrared ray is further absorbed by the infrared absorption film 8, the sensitivity of the infrared sensor is not reduced.

The first embodiment is not limited thereto. The shape of the hollow part 2 is not limited to a rectangular shape, and may be a round shape, etc. The thermopile pattern can be formed according to the shape.

Next, the method for manufacturing the above infrared sensor will be described.

Figure 6:
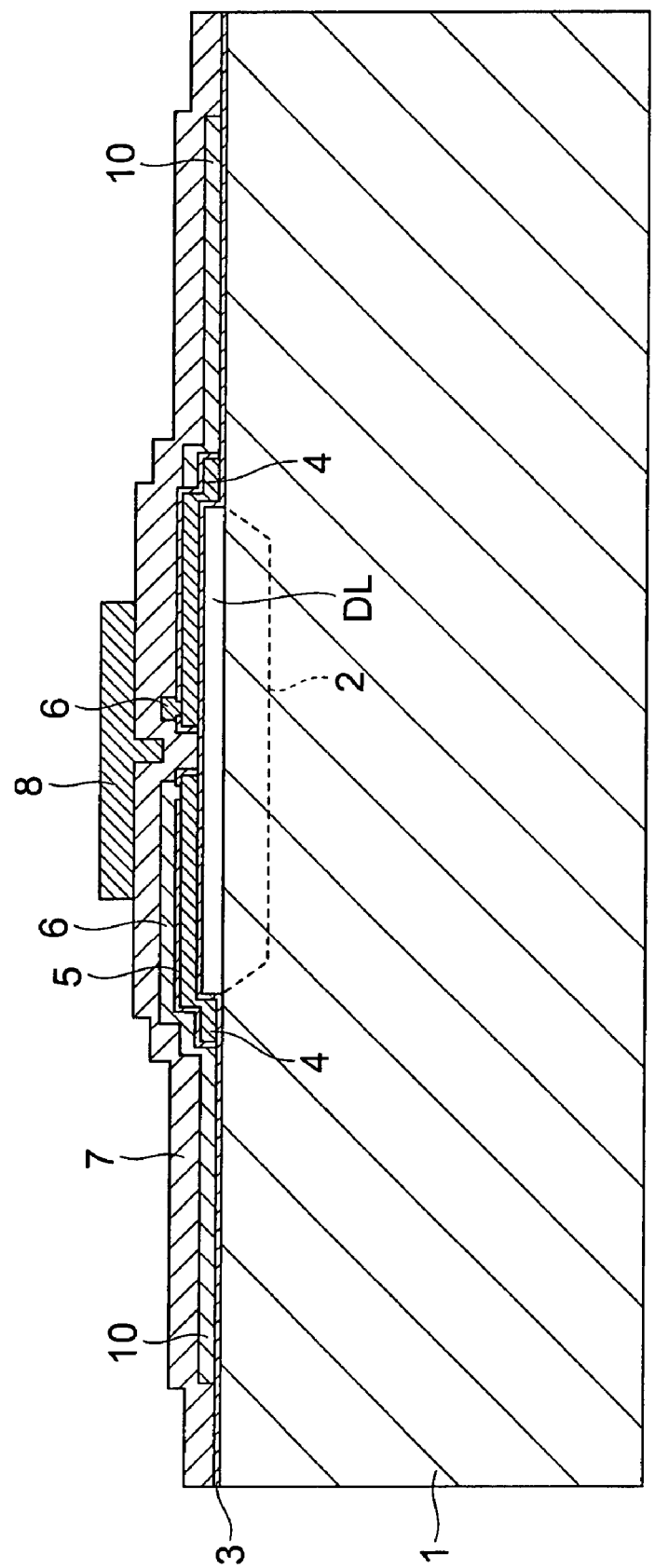
FIG. 6 illustrates the manufacturing process of an infrared detecting part.

FIG. 6 illustrates the manufacturing process of an infrared detecting part.

First, the semiconductor substrate 1 (first silicon substrate) which is made of silicon is prepared. A sacrificial layer which is made of polysilicon is formed on the surface of the semiconductor substrate 1. This sacrificial layer will be removed in a post process, and will constitute the upper space DL of the hollow part 2. That is, before the etching of the sacrificial layer, it means that the upper space DL is filled with the sacrificial layer.

Herein, the hollow part 2 may be formed by only etching the sacrificial layer, or may be formed by further etching the bulk semiconductor substrate 1 in the thickness direction thereof. By such a meaning, the semiconductor substrate 1 side of the hollow part 2 in FIG. 6 is shown with a dotted line.

The thin film 3 which is composed by the insulating layer is formed on the surface of the semiconductor substrate 1 after the formation of the sacrificial layer to cover the exposed surfaces of the semiconductor substrate 1 and sacrificial layer with the thin film 3. The above sacrificial layer is formed with substantially the same size as that of the hollow part 2 at the thin film 3 side of the semiconductor substrate 1. Next, after forming the thermopile pattern which is composed by the polysilicon film 4, the insulating film 5 and the aluminum film 6, and the terminal 10, the passivation film 7 is formed.

Then, the thin film 3 and the passivation film 7 are opened to form the etching hole 13, and the infrared absorption film 8 is formed on the thermopile pattern (refer to FIG. 2). The infrared absorption film 8 may be formed after the etching to be described later.

A protection mask is formed on the rear surface of the semiconductor substrate (first silicon substrate) 1 as required. For example, a solution obtained by warming a mixed-solution of ethylene diamine, pyrocatechol and water is used as an etching solution introduced into the etching hole 13. The semiconductor substrate 1 is a (100) substrate, and a (100) plane is exposed. When the etching solution is introduced into the etching hole 13, the etching solution penetrates the polysilicon sacrificial layer through the etching hole 13, and the anisotropic etching of the semiconductor substrate 1 is started according to the design while etching of this sacrificial layer or after etching is completely performed.

Thereby, the membrane structure having the hollow part 2 can be formed. The etching depth is about 2 to about 30 μm. Only the polysilicon sacrificial layer may be etched in order to form the membrane structure. In this case, the thickness of the polysilicon sacrificial layer is set to 0.2 to 3 μm. A hydrazine solution, etc., may be used for etching in addition to the etching solution, or the dry etching using $XeF_2$, etc., can also be used.

Figure 7:
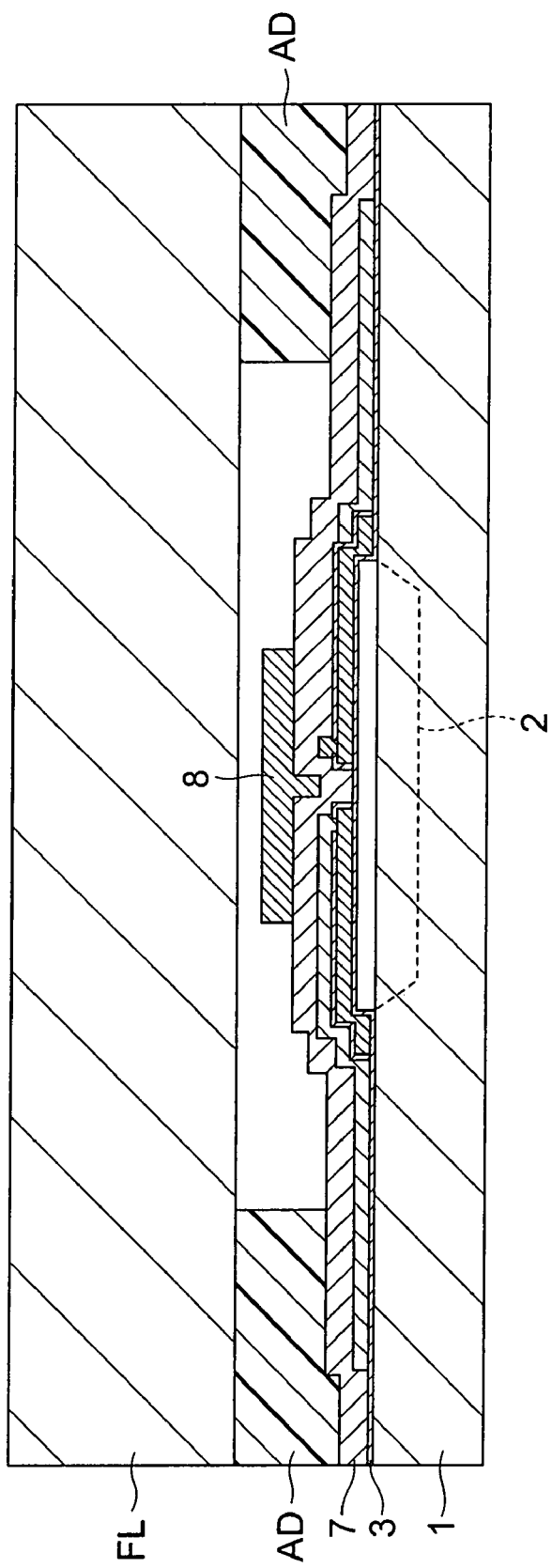
FIG. 7 illustrates the attaching process of an infrared transmissive substrate FL.

FIG. 7 illustrates the attaching process of the infrared transmissive substrate FL.

After the formation of the hollow part 2, the infrared transmissive substrate (second silicon substrate) FL which also serves as an increase in mechanical strength and is made of silicon is attached. First, the adhesive layer AD which is made of pyrex glass is formed on the outer edge part of the semiconductor substrate (first silicon substrate) 1. The infrared transmissive substrate (second silicon substrate) FL is superimposed on the adhesive layer AD, and the adhesive layer AD and the infrared transmissive substrate (second silicon substrate) FL are anodic-bonded to each other in vacuum or a nitrogen atmosphere. The adhesive layer AD may be formed before the etching. The adhesive layer AD may be formed at the infrared transmissive substrate (second silicon substrate) FL side.

Then, the rear surface side of the semiconductor substrate (first silicon substrate) 1 is mechanically and chemically polished to thin the semiconductor substrate 1. The thickness of the outer edge part of the semiconductor substrate 1 after thinning is about 50 to about 200 μm.

Figure 8:
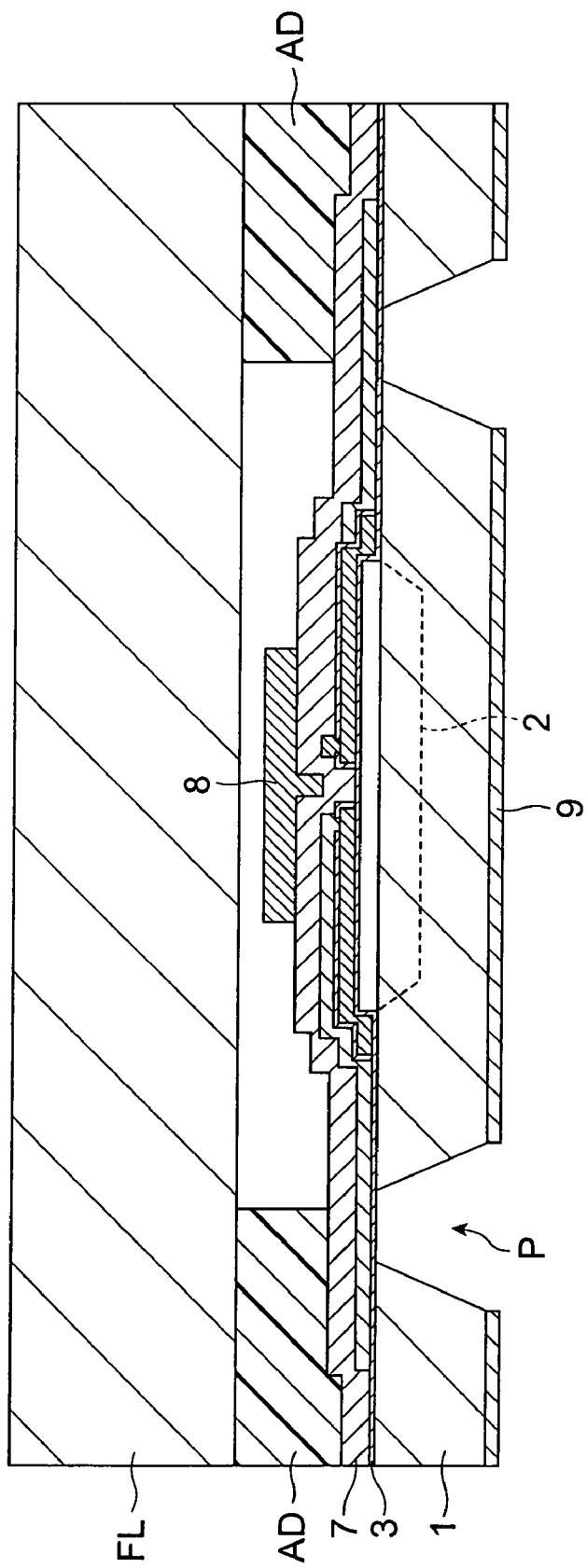
FIG. 8 illustrates the forming process of a through hole P.

FIG. 8 illustrates the forming process of the through hole P.

Next, a mask 9 resistant to the etching solution is formed on the rear surface of the semiconductor substrate 1. Herein, the mask 9 is made of SiN. After a region in which the through hole is planned to be formed by the mask 9 is opened, the etching solution such as a KOH aqueous solution is introduced into the opening to etch the first semiconductor substrate 1 in the inner direction.

In this wet etching, the anisotropic etching advances, and when the etching solution reaches the thin film (thermal insulating film) 3, the etching is stopped to form the taper-shaped through hole P. The above mask 9 may be removed as required, and then the new insulating film 9 may be formed on the rear surface of the substrate.

Alkali aqueous solutions such as hydrazine, EDP (Ethylene Diamine Pyrocatechol) and TMAH (TetraMethyl Ammonium Hydroxide) can be used as the etching solution in addition to the KOH aqueous solution. Films having high alkali resistance such as $SiO_2$ can be used as the mask material in addition to SiN, and can be formed by a CVD (Chemical Vapor Deposition) method, etc. Since the infrared transmissive substrate (second silicon substrate) FL exists via the adhesive layer AD even when the etching is completed in this example, no damage of the film is generated when and after the etching is completed, and the process can be advanced without reducing the yield.

Figure 9:
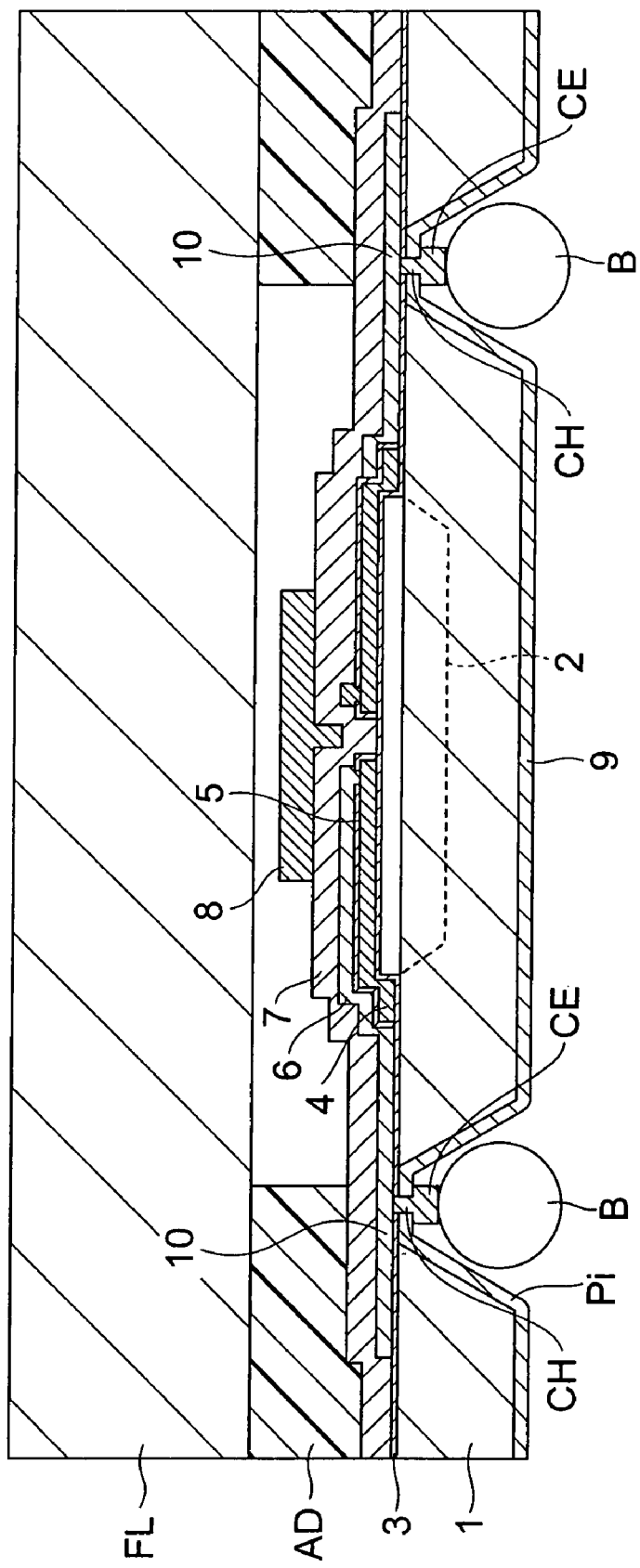
FIG. 9 illustrates the attaching process of a bump.

FIG. 9 illustrates the attaching process of a bump electrode.

Next, the insulating layer Pi which is composed by the passivation film through the CVD method or the sputtering method is formed on the inner wall face of the through hole P. Then, the opening (the contact hole) CH is formed in the bottom part of the insulating layer Pi and the region of the thin film 3 corresponding thereto to expose the rear surface side of the terminal 10. The contact electrode (under bump metal) CE is formed on the exposed surface of the terminal 10 by an electroless plating, etc. The bump B is arranged in the through hole P, and is brought into contact with the contact electrode CE. The end part of the bump B of the opposite side to the contact electrode CE is projected from the rear surface of the semiconductor substrate 1.

The contact electrode CE can also be formed by depositing and spattering, etc., in addition to the electroless plating. The quality of the material of the contact electrode CE may be a metal single layer such as Ni, Au, Cr, Cu and Pt, an alloy thereof, or a laminated film thereof. Though the bump B which is made of solder, etc., is formed so as to be brought into contact with the contact electrode CE, a ball-mounting method, a printing method, a plating method and a bonding method, etc., can be used for the formation of the bump B. In the ball-mounting method, the bump formation part is recessed, and the positional deviation can be prevented. Additionally, a solder paste is directly buried in the recessed part by a squeegee in the printing method to reflow, and thereby the ball can be formed.

The above process is performed in a wafer state, and a chip is completed by finally dicing the substrate bonding part. That is, the region on the semiconductor substrate which is anodic-bonded via the adhesive layer AD after the above bump arrangement process or the infrared transmissive substrate FL is set to a dicing line, and this dicing line is cut.

That is, when the dicing line between the infrared sensors is cut after the formation of the through hole P in the case of forming a plurality of infrared sensors, the semiconductor substrate can be separated into each of the infrared sensors. In this case, since the semiconductor substrate 1 and the infrared transmissive substrate FL are bonded and the formation of the through hole P is completed, products about equal to a final shipping configuration are completed by separating into each of the infrared sensors having a chip size by the dicing. Therefore, according to this manufacturing method, the small thin infrared sensor can be manufactured at low cost at high productivity.

Figure 10:
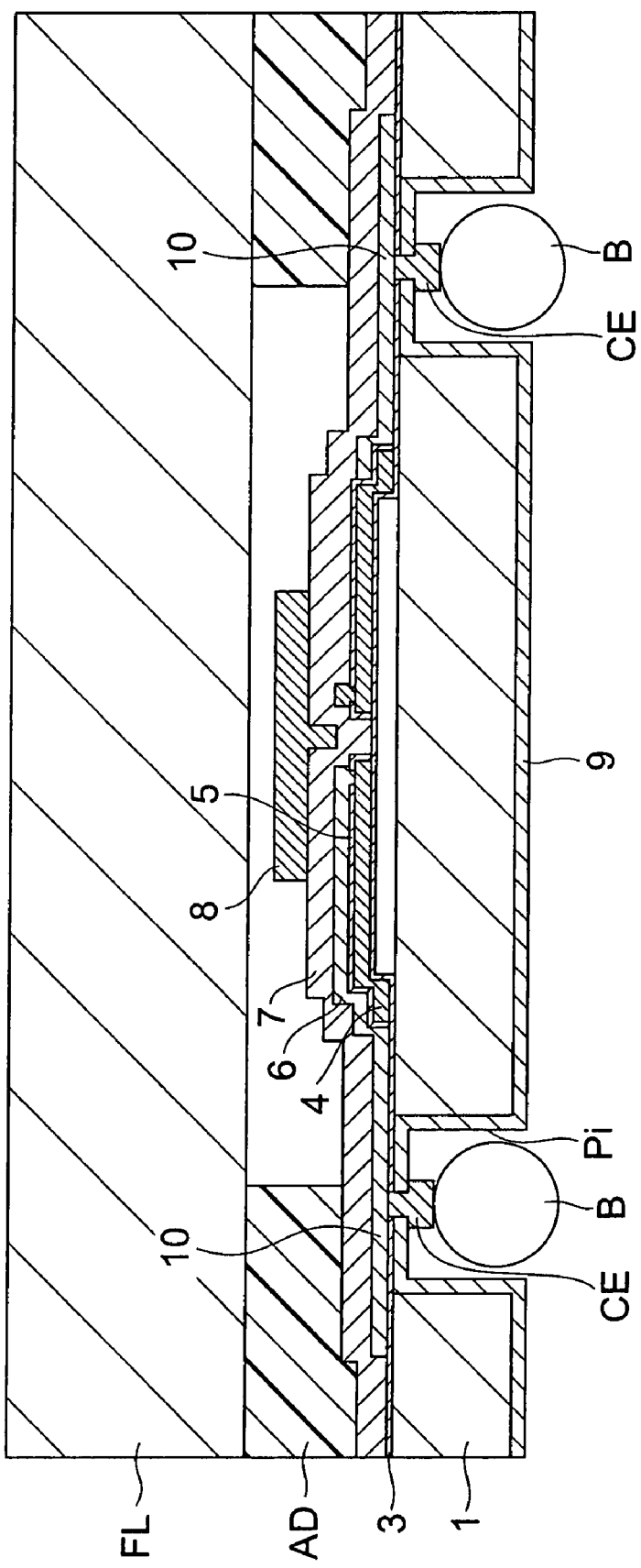
FIG. 10 is a cross sectional view of an infrared sensor having a through hole P formed by a substantially vertical etching with respect to the rear surface of a substrate.

FIG. 10 is the cross sectional view of the infrared sensor having the through hole P formed by etching substantially vertically the rear surface of the substrate.

This infrared sensor is the same as the above infrared sensor except the shape of the through hole P. When the through hole on which the bump B is formed is made by the dry etching, the formation method is almost the same as the alkali wet etching. A part corresponding to the through hole of the semiconductor substrate 1 is dry-etched using the etching mask 9 as a metal layer or a laminated film thereof such as $SiO_2$, resist or aluminum using a reactive ion etching (RIE) method.

In the thin film (insulating film) 3 directly under the terminal 10 of silicon and aluminum, the etching is alternatively stopped. The etching rate can be increased by using an ICP-RIE using a high-density plasma as the RIE, and the substantially vertical etching can be performed. When the resist is used as an etching mask, the resist is removed by an oxygen ashing, etc., and the process after the formation of the through hole is executed. The plane shape of the through hole P can also be made into a round shape.

Figure 11:
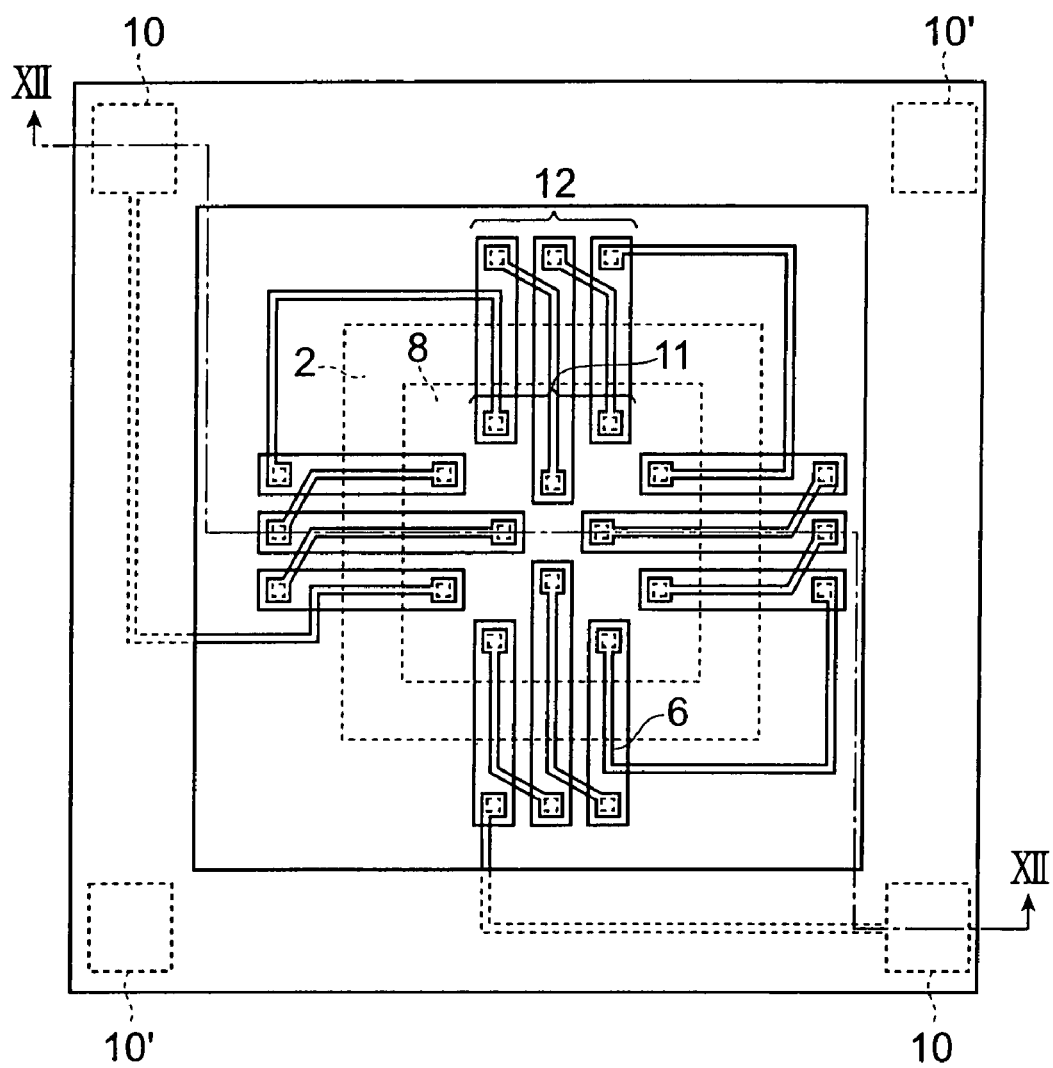
FIG. 11 is a plan view of an infrared sensor according to another embodiment with an infrared transmissive substrate FL omitted from the infrared sensor.
Figure 12:
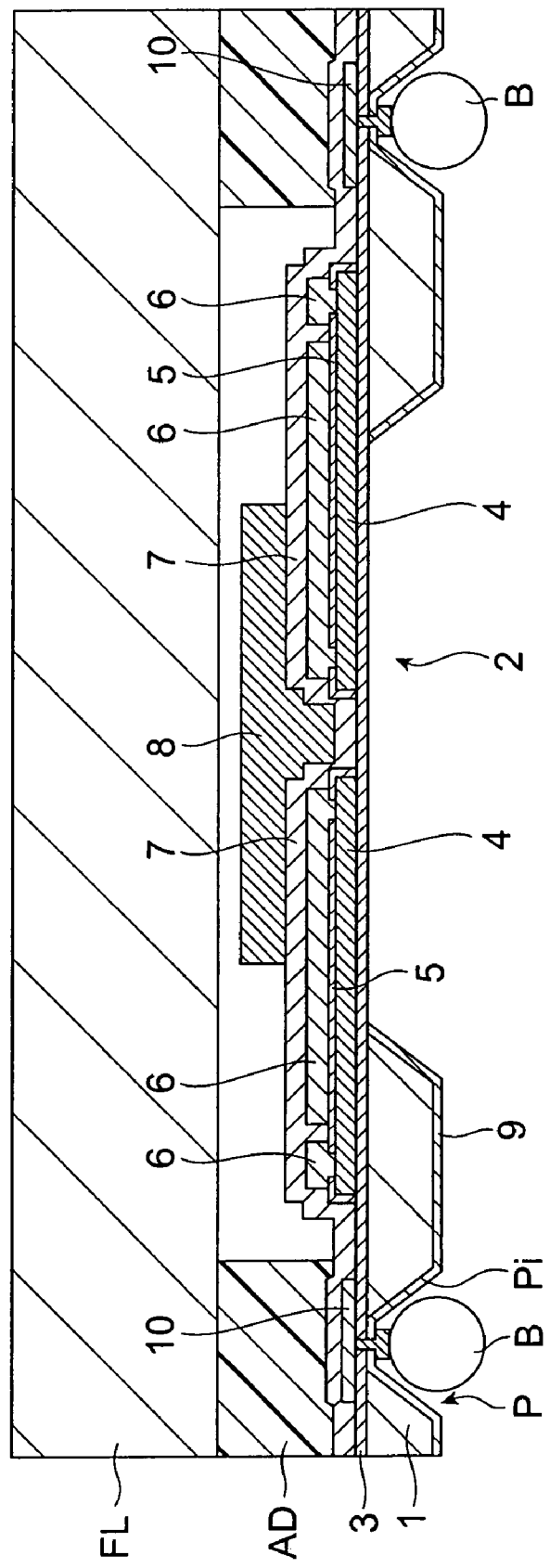
FIG. 12 is a cross sectional view of the infrared sensor shown in FIG. 11 taken along line XII-XII.

FIG. 11 is a plan view of an infrared sensor according to another embodiment with an infrared transmissive substrate FL omitted from the infrared sensor. The notation of this plan view conforms to FIG. 2. FIG. 12 is a cross sectional view of the infrared sensor shown in FIG. 11 taken along line XII-XII.

Referring to this infrared sensor, only the shape of the hollow part 2 and the method for manufacturing the part are different from those of the infrared sensor shown in FIG. 2, and the other configurations and the manufacturing method thereof are the same. In this example, since the hollow part 2 is opened to the rear side of the semiconductor substrate 1, the etching hole is omitted.

Explaining the formation method of the hollow part 2, after the thin film 3, the thermopile pattern, the passivation film 7 and the infrared absorption film 8 are formed on the surface of the semiconductor substrate 1 in which the hollow part 2 is not formed, a mask made of SiN, etc., which has a resistance to the silicon etching solution is formed on a face (rear surface) of the opposite side to the surface of the semiconductor substrate 1 on which the thin film 3 is formed. The mask of a region where the hollow part 2 is desired to be formed is opened, and the region is etched while the surface of the semiconductor substrate 1 is protected.

Thereby, the etching is started from the opening of the mask on the rear surface, and the etching is stopped when reaching to the thin film 3 resistant to the etching solution. For example, the KOH aqueous solution, etc., is used for the etching solution, and the anisotropic etching can be performed when the (100) substrate is used for the first semiconductor substrate 1. The membrane structure having the hollow part 2 shown in FIG. 12 can be formed by this etching. The etching of this rear surface can be simultaneously performed with the formation of the through hole P from the rear surface described in the first embodiment.

The insulating film 9 is formed at the rear surface side of the semiconductor substrate 1 as required. The hollow part 2 opened in the rear surface of the semiconductor substrate may be blocked by adhering a substrate, etc., so as to provide a space as required. Thereby, the damage of the membrane can be prevented.

The shape of the above hollow part 2 is not limited to a rectangular shape, and may be a round shape, etc. The thermopile pattern can be formed according to the shape. When the etching hole is used, the shape and part thereof can be changed by the thermopile pattern.

Figure 13:
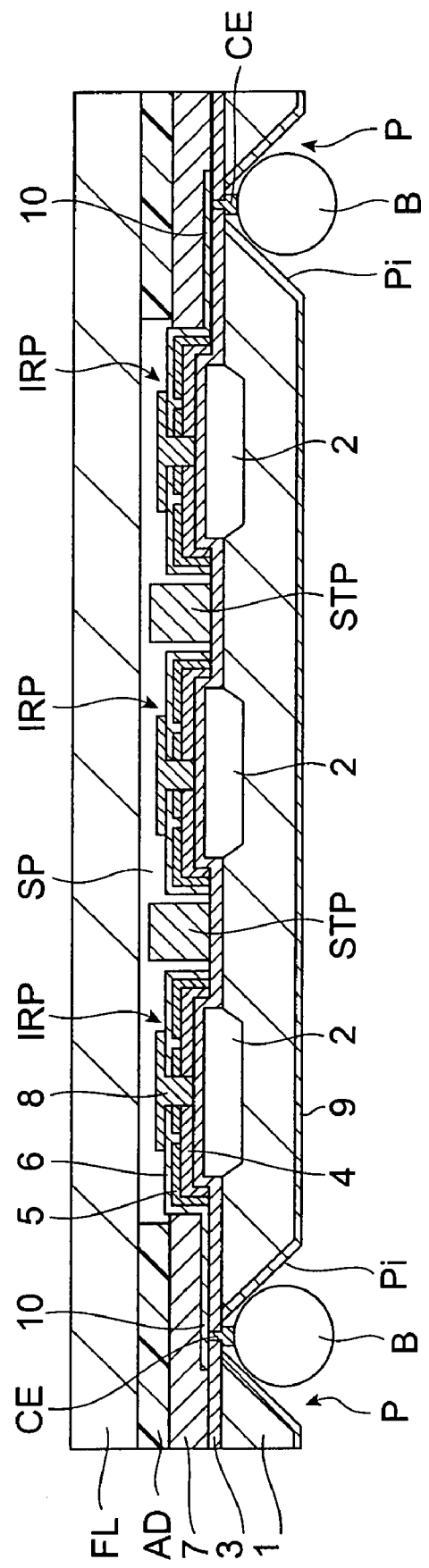
FIG. 13 is a cross sectional view of an infrared sensor provided with a plurality of infrared detecting parts 4 and 6.

FIG. 13 is a cross sectional view of the infrared sensor provided with the above plurality of infrared detecting parts 4 and 6. Herein, for clarification of the description, the infrared detecting parts 4 and 6 are shown by a symbol IRP, and description of the detailed configuration is omitted. The infrared sensor has an internal space SP between the semiconductor substrate 1 and the infrared transmissive substrate FL. In this space SP, there are provided deflection preventing walls (spacers) STP for restraining the deflection of the infrared transmissive substrate FL to the infrared detecting part IRP side.

When the infrared transmissive substrate FL is deflected, the infrared transmissive substrate FL comes into contact with the infrared detecting part IRP to thermally connect the infrared transmissive substrate FL with the infrared detecting part IRP, and thereby the sensitivity of the infrared detecting part IRP is sometimes decreased or the infrared detecting part IRP is sometimes damaged. This deflection preventing wall STP is provided in order to prevent reduction in sensitivity and damage, and the height of the deflection preventing wall STP from the semiconductor substrate 1 is higher than that of the infrared detecting part IRP. When the infrared transmissive substrate FL is deflected, the infrared transmissive substrate FL comes into contact with the preventing wall STP, thereby the amount of the deflection of the infrared transmissive substrate FL is restrained.

Though there are a plurality of the infrared detecting parts IRP, and each of the infrared detecting parts IRP constituting a pixel independently outputs a signal, in this example, only two bumps B for extracting an output are displayed for clarification of the description. The deflection preventing walls STP are formed on the thin film 3 having no hollow part below, and are provided between the infrared detecting parts IRP.

When there are a plurality of the infrared detecting parts IRP, the sensor size is increased with the infrared transmissive substrate FL. However, the deflection preventing walls STP are provided between the infrared detecting parts IRP, and thereby the amount of the deflection can be wholly restrained. The formation position of the deflection preventing wall STP is set to the region between the adjacent hollow regions 2.

Hereinafter, the deflection preventing wall STP will be described in detail.

A chip size is increased when a one-dimensional or two-dimensional infrared detecting part array is manufactured. When this chip size is large and the semiconductor substrate 1 is adhered to the infrared transmissive substrate FL only at the circumference of the chip, the size in the plane direction of the internal space SP is increased.

Therefore, there is a risk that the infrared detecting part IRP formed on the surface of the substrate may come into contact with the infrared transmissive substrate FL by warpage and external force (for example, at the time of bonding the wafer and mounting after chipping) of the wafer to damage element parts or to reduce the sensitivity by escape of the heat due to the contact of the infrared transmissive substrate FL.

As a solution to the above problem, the deflection preventing wall STP is provided at every interval of adjacent pixels or between the pixels of a certain pixel interval. Thereby, the size of the internal space SP in the plane direction can be reduced, and the contact of the infrared detecting part IRP and infrared transmissive substrate FL due to warpage and external force of the wafer can be prevented. The deflection preventing wall STP can suppress the destruction of the element due to pressure application in the case of mounting flip chip bonding, etc.

The deflection preventing wall STP is formed by depositing a material, compound or alloy thereof such as Al, Ti, Au, Ni, Cr, W, Si, Pt, Cu, SiN, $SiO_2$, BPSG and PSG as the single layer or the laminate on a part where the deflection preventing wall is desired to be formed on the semiconductor substrate 1 using the vapor deposition, the sputter and the CVD, etc., and patterning the material, etc., using etching and lift-off, etc.

The plating method may be used for this formation. A glass frit, a resin and a solder paste may be printed and cured for this formation. Furthermore, a photosensitive resin may be used. Examples of the resin main components of the photosensitive resin include polyimide, an acrylate, PMMA (polymethyl-methacrylate), silicone and epoxy. The photosensitive resin can be very inexpensively formed with a few processes.

As described above, the method for manufacturing the above infrared sensor includes the steps of: forming the membrane structure composed by the thin film 3 on the semiconductor substrate 1; forming the infrared detecting part IRP on the membrane structure; partially forming the adhesive layer AD on the semiconductor substrate 1, the infrared transmissive substrate FL, or both the substrates so that a space is formed between the semiconductor substrate 1 and the infrared transmissive substrate FL made of silicon, and then bonding the semiconductor substrate 1 to the infrared transmissive substrate FL via this adhesive layer AD; and forming the through hole P in the semiconductor substrate 1 from the opposite side of the semiconductor substrate 1 to the infrared transmissive substrate FL.

The through hole P is formed in a position opposed to the adhesive layer AD. According to this manufacturing method, the through hole, bottom thereof and insulating film Pi, etc., are restrained from being deteriorated and damaged at the time of the formation of the through hole by the support due to the adhesive layer AD, and thereby the above infrared sensor having excellent characteristics can be manufactured.

A bolometer, a thermistor, a pyroelectric element, a bimetallic element, a diode, a crystal oscillator and a golay cell can also be used in addition to the thermopile as the infrared detecting part IRP.

Though the silicon substrate is used as the infrared transmissive substrate FL in the above description, a substrate which transmits the infrared ray such as a germanium substrate and an infrared transmissive glass can also be used in addition to the silicon substrate as the infrared transmissive substrate FL.

A low-melting glass, a solder, a metal (a simple substance, an alloy) and a resin, etc., can be used as the material of the adhesive layer AD, and a single layer and a lamination may be used in order to increase the adhesive strength and reliability thereof. The above adhesion method is not limited to the anodic bonding, and the adhesive layer and substrate may be adhered by applying heat, pressure or an ultrasonic wave, etc., as required.

Although it is not shown, an adhesion layer for improving the adhesion of the adhesive layer AD and substrate may be formed. The substrates may be adhered after forming the adhesive layer AD at the infrared transmissive substrate FL side, and may be adhered after forming the adhesive layer AD on both the substrates. Furthermore, the adhesive layer AD may be formed only at the infrared transmissive substrate FL side.

In addition to a technique for directly connecting the input/output terminal 10 from the infrared detecting part to the bump electrode, a circuit for processing the output signal of the infrared detecting part may be provided on the semiconductor substrate 1, and the input/output terminal of this circuit may be connected to the bump electrode. The terminal can also be electrically connected to the bump by forming the thermistor and diode for monitoring the temperature of the substrate on the semiconductor substrate 1.

In order to prevent the stray light of the infrared ray made incident from the semiconductor substrate side, a light-shielding film such as metal may be formed at a part having no through hole on the face of the opposite side of the semiconductor substrate to the infrared transmissive substrate.

In order to prevent the heat from escaping to the semiconductor substrate side by the radiation from the infrared detecting part, an infrared reflection film which is made of metal, etc., may be formed on a face which is located opposite the infrared detecting part of the semiconductor substrate. Thereby, the infrared ray made incident from the semiconductor substrate side can be blocked including one from the semiconductor substrate itself.

INDUSTRIAL APPLICABILITY

The present invention can be used for the infrared sensor and the method for manufacturing the same.

The invention claimed is:

1. A method for manufacturing an infrared sensor, comprising the steps of:
    forming an infrared detecting part on a thin film constituting a part of a membrane planned to be formed on a semiconductor substrate;
    forming a hollow part at the lower side of the thin film on which the infrared detecting part is formed to form a membrane structure;
    partially forming an adhesive layer on at least one of the semiconductor substrate and an infrared transmissive substrate so that a space is formed between the semiconductor substrate and the infrared transmissive substrate, and bonding the infrared transmissive substrate to the semiconductor substrate via the adhesive layer; and
    forming a through hole in the semiconductor substrate from the opposite side of the semiconductor substrate to the infrared transmissive substrate,
    wherein the through hole is formed in a position opposed to the adhesive layer.

2. The method for manufacturing the infrared sensor according to claim 1, wherein a dicing line between the infrared sensors is cut after forming the through hole when a plurality of infrared sensors are formed, to separate the infrared sensors into each of the infrared sensors.

* * * * *